United States Patent [19]

Hiller

[11] Patent Number: 5,218,307

[45] Date of Patent: Jun. 8, 1993

[54] FAULT DETECTION CIRCUIT AND METHOD FOR TESTING A MULTIPLE CONDUCTOR CABLE HAVING A SHIELD

[75] Inventor: Matthew J. Hiller, Montoursville, Pa.

[73] Assignee: Alcan Aluminum Corporation, Cleveland, Ohio

[21] Appl. No.: 920,156

[22] Filed: Jul. 27, 1992

Related U.S. Application Data

[63] Continuation of Ser. No. 608,230, Nov. 2, 1990, abandoned.

[51] Int. Cl.⁵ .......................................... G01R 31/02
[52] U.S. Cl. ................................. 324/541; 324/539; 324/542; 324/509
[58] Field of Search ............... 324/508, 509, 522, 523, 324/527, 539–542, 521, 544, 543

[56] References Cited

U.S. PATENT DOCUMENTS

| | | | |
|---|---|---|---|
| 2,610,229 | 9/1952 | Cranford | 324/542 |
| 3,377,551 | 4/1968 | Le Doux | 324/539 |
| 3,600,673 | 8/1971 | Kohke . | |
| 3,696,291 | 10/1972 | Horne . | |
| 3,736,503 | 5/1973 | Coleman et al. . | |
| 3,778,801 | 12/1973 | Nudelmont . | |
| 3,936,730 | 2/1976 | Pittman . | |
| 4,200,836 | 4/1980 | Okada et al. . | |
| 4,301,399 | 10/1981 | Miller et al. | 324/541 |
| 4,398,232 | 8/1983 | Elmore | 324/521 X |
| 4,835,479 | 5/1989 | Haines . | |
| 4,853,628 | 8/1989 | Gouldsberry et al. . | |

FOREIGN PATENT DOCUMENTS

| | | | |
|---|---|---|---|
| 2610115 | 7/1988 | France | 324/521 |
| 21278 | 1/1990 | Japan | 324/521 |

OTHER PUBLICATIONS

U.L. Specification #1569, pp. 34–35 The Underwriters Laboratories, Inc., Jul. 1983.

*Primary Examiner*—Jack B. Harvey
*Attorney, Agent, or Firm*—Calfee, Halter & Griswold

[57] ABSTRACT

A fault detection circuit for testing conductor-to-conductor and conductor-to-ground faults in multiple conductor shielded cables. The fault detection circuit includes a voltage source that provides a plurality of distinct voltage phases. Each distinct phase from the voltage source is connected through a resistance and a logic circuit to an individual conductor in the cable. The resistance limits the current flowing through the fault detection circuit to reduce the risk of electrical shock to the operator. The logic circuit includes control relays which are responsive to phase-to-phase or phase-to-ground faults in the cable conductors. The logic circuit also provides a visual indication of a fault in the cable.

20 Claims, 2 Drawing Sheets

FAULT DETECTION CIRCUIT AND METHOD FOR TESTING A MULTIPLE CONDUCTOR CABLE HAVING A SHIELD

This is a continuation of copending application Ser. No. 07/608,230, filed on Nov. 2, 1990, now abandoned.

TECHNICAL FIELD

The present invention relates generally to a fault detection circuit for testing cables. More particularly, the invention provides a low current electrical device for testing conductor-to-conductor and conductor-to-ground faults in multiple conductor shielded cables.

BACKGROUND

Shielded cables having multiple conductors are used in a variety of environments, such as in housing structures or manufacturing facilities. The conductors in the cable are typically twisted together to form a bundle, and are covered along their length by an armor shield. Insulation is disposed around each of the conductors, and an additional layer of insulation can be disposed between the bundle of conductors and the armor shield to prevent faults from occurring between conductors or between the conductors and the shield.

The impact resistance of the shielded cable determines the suitability of a cable for a particular environment. The layers of insulation, along with the armor shield, provide the impact resistance for the cable. A less resistant cable can be used in milder environments, while a more resistant cable is necessary in harsher environments.

A variety of tests have been developed to test the impact resistance of a cable. The tests generally provide for impacting a selected portion of the cable with a test block of a particular weight from a selected height. The ability of the cable to withstand the impact of the block determines the impact resistance of the cable, and hence the suitability of the cable for a particular environment.

As it is being tested, the cable either withstands the impact of the test block, or a fault occurs within the cable. The fault can be caused by either a conductor being driven through the conductor insulation into contact with another conductor, or by a portion of the armor shield being driven through the outer layer of insulation into contact with a conductor. In either case, the impact resistance of the cable has been exceeded.

In order to determine if a fault has occurred in the cable during an impact test, a number of different types of fault detection circuits have been developed. For example, UL test #1569 tests the impact resistance of an eleven foot cable by impacting the cable at ten separate locations, wherein each location is at least twelve inches apart. Two of the insulated conductors in the cable are connected in series through a three watt, 120 volt neon lamp to the energized conductor of a two wire, grounded 120 volt 48-62 Hertz AC power supply. A third, bare or insulated grounding conductor in the cable is connected to the armor, to all parts of the impact apparatus, to earth ground, and to the grounded supply wire. The test block is impacted along the cable and the neon lamp indicates if a fault exists.

Additionally, Coleman et al., U.S. Pat. No. 3,736,503, discloses an electrical continuity and short circuit testing device for checking pairs of conductors in an insulated cable. One conductor in each pair is connected to the positive voltage supply from a step-up transformer, while a second conductor from each pair is connected to the negative voltage supply from the transformer. If a fault is present between the pair of conductors, current flows through the fault and a lamp is illuminated. Coleman further discloses providing a DC bias to illuminate the lamp after the fault is corrected.

Further, Le Doux, U.S. Pat. No. 3,377,551, discloses a multi-phase fault indicator circuit that utilizes current transformers to test conductors connected in-line to a load. The current transformers are formed by the test conductors as the primary windings, and the indicator circuit conductors as the secondary windings. The secondary windings each have two ends, wherein each end is wound around two phases of the primary windings at points between which faults are to be indicated. If a fault exists in the conductors, either as a phase-to-phase or a phase-to-ground fault, current is induced in the secondary windings and a voltage drop appears across a fault indicator to activate a protective relay.

The foregoing methods of testing attempt to provide fault indicator circuits which test conductor-to-conductor and conductor-to-ground faults in multiple conductor cables. However, these devices are not without drawbacks. For instance, although the UL specification alleges that the UL circuit is designed to test conductor-to-ground and conductor-to-conductor faults, the insulated conductors in the UL test are connected in-phase at the same potential. Accordingly, it has been applicant's experience that a potential difference will thereby only develop between a conductor shorted to ground, and not between two conductors shorted together. The UL test therefore only effectively measures conductor-to-ground faults and not conductor-to-conductor faults.

Moreover, the UL test and Coleman disclose high voltages and large currents flowing through a pair of shorted conductors. Additionally, Le Doux discloses test conductors connected in-line to a generator. Accordingly, the UL test, Coleman and Le Doux can thereby increase the risk of electrical shock to the operator during an impact test.

SUMMARY OF THE INVENTION

The present invention provides a new and useful fault detection circuit for testing conductor-to-conductor and conductor-to ground faults in multiple conductor shielded cables. Additionally, the present invention provides a low current fault detection circuit which reduces the risk of electrical shock to the operator during an impact test.

According to one aspect of the invention, the detection circuit includes a resistance and a logic circuit connected in series between each phase of a multiple phase voltage source and each conductor in the cable. The multiple phase voltage source provides a distinct voltage phase to each conductor, while the resistance limits the current flowing through the detection circuit. The logic circuit includes control relays which are responsive to phase-to-phase and phase-to-ground faults in the conductors. When a fault occurs, the logic circuit also provides a visual indication of the fault in the cable.

Initially during an impact test, each control relay is electrically connected to a distinct phase from the voltage source. The armor shield on the cable is connected to ground. Power is then supplied to the logic circuit and a first set of contacts are closed to complete a portion of the electrical path between the voltage source and each control relay. A reset button is pressed, which allows the test to be conducted if there are no pre-existing faults in the cable. A test button is then pressed, which closes another set of contacts to establish electrical continuity between the voltage supply and each test conductor.

The impact test is performed and a test block is dropped on a portion of the cable. If a fault is present between two conductors, or between a conductor and the grounded shield, a potential difference is established across the coil of at least one control relay due to the potential difference between two of the phases of the multiple phase voltage source, or between one of the phases and ground. The potential difference energizes one or more of the control relays connected to the shorted conductors. When a control relay is energized, the logic circuit provides an indication that a fault has occurred by illuminating a lamp, or by indicating the fault on a counter.

Accordingly, the present invention provides for testing conductor-to-conductor and conductor-to-ground faults in multiple conductor cables. Additionally, the invention provides for reducing the risk of electrical shock to the operator during an impact test of the cable.

Other features and advantages of the present invention will become apparent from the following detailed description and accompanying drawings which form a part of the specification.

DETAILED DESCRIPTION OF THE PREFERRED EMBODIMENT

Figures 1, 1A:
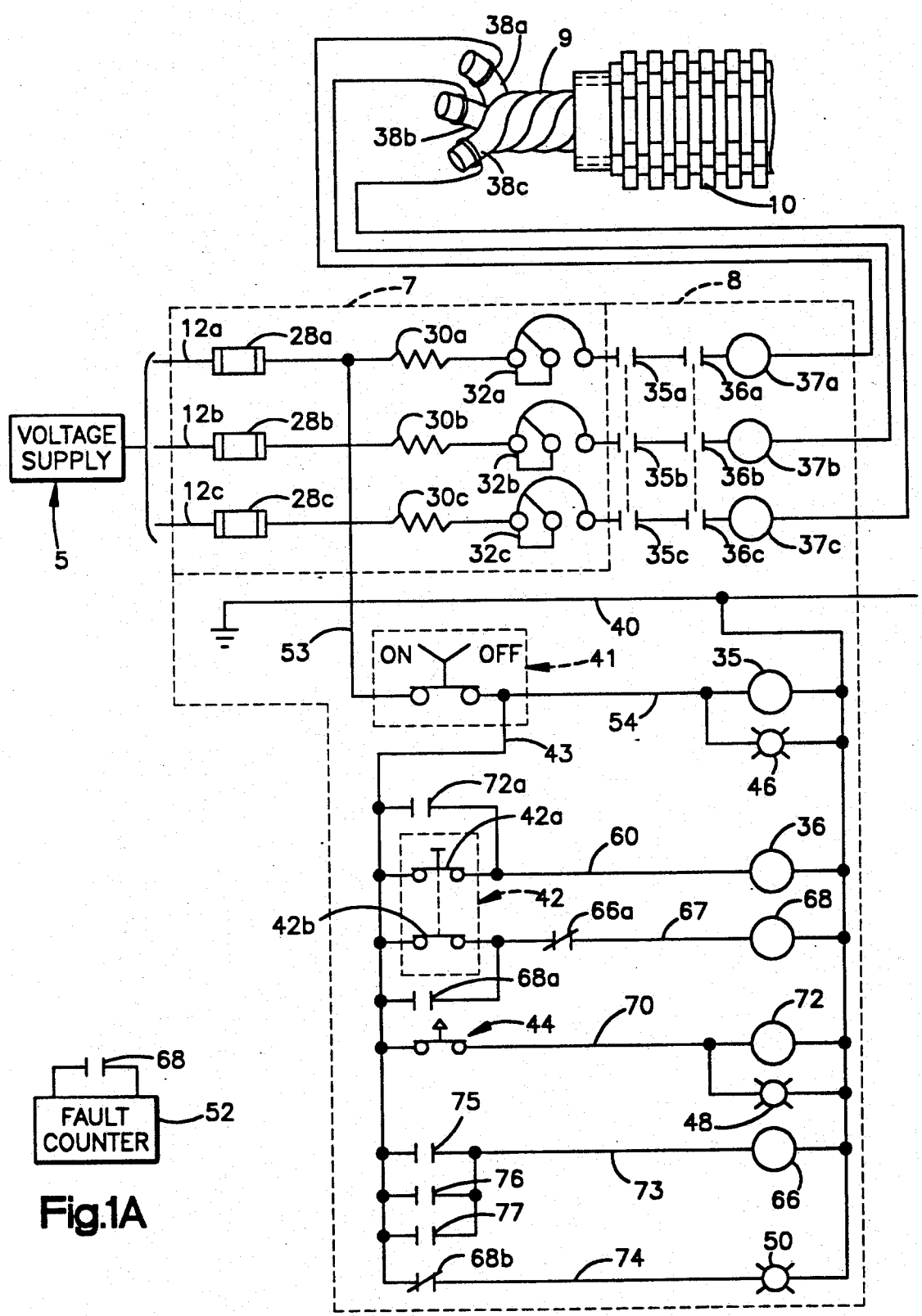
FIG. 1 is a schematic illustration of the fault detection circuit constructed in accordance with the present invention.
FIG. 1A is a schematic illustration of the fault counter constructed in accordance with the present invention.

Referring to the drawings, and initially to FIG. 1, a fault detection circuit is provided which is adapted to test conductor-to-conductor and conductor-to-ground faults in multiple conductor shielded cables.

The fault detection circuit includes a voltage supply, indicated generally at 5, a protection circuit, schematically outlined at 7, and a logic circuit, schematically outlined at 8. The fault detection circuit is adapted to be connected to a plurality of conductors, schematically illustrated at 9, in a conventional shielded cable 10.

The voltage supply 5 is conventional in design and is preferably a 220 volt AC three phase system. The voltage supply provides 220 volts phase-to-phase and 110 volts phase-to-ground. The three phases provided by the voltage supply are approximately 120° apart. However, it is also within the scope of this invention for the voltage supply to provide additional distinct phases.

The voltage supply 5 is electrically connected to the protection circuit 7. In particular, a first input 12a, a second input 12b, and a third input 12c to the protection circuit 7 are each adapted to receive a distinct phase from the voltage supply 5. Each input 12a-12c is connected in series to a respective fuse 28a-28c (each 15 amps), a respective resistor 30a-30c (each 900 ohms), and a respective variable resistor 32a-32c (each with a maximum of 5,000 ohms). For example, voltage supply 5 is adapted to provide a distinct voltage phase to input 12a, fuse 28a, resistor 30a, and variable resistor 32a. Each fuse 28a-28c is adapted to provide overload protection for the fault detection circuit, while the resistors 30a-30c and variable resistors 32a-32c are adapted to limit the current flowing through the fault detection circuit and into the test conductors.

Each variable resistor 32a-32c in the protection circuit 7 is electrically connected to the logic circuit 8. In particular, each variable resistor is individually connected in series through two contacts to one end of a line of a control relay in the logic circuit. Specifically, variable resistor 32a is connected through contacts 35a and 36a to one end of the coil of control relay 37a. Similarly, variable resistor 32b is connected through contacts 35b and 36b to control relay 37b. Finally, variable resistor 32c is connected through contacts 35c and 36c to one end of the coil of control relay 37c. Each control relay 37a-37c is also connected to a respective conductor clamp 38a-38c. Each conductor clamp 38a-38c is conventional in design and is adapted to be removeably connected to an individual conductor in a shielded cable, as illustrated in FIG. 1.

The contacts 35a-35c and 36a-36c are opened and closed by control relays 35, 36, respectively. The control relays 35, 36 are conventional in design and include a coil responsive to a potential difference. A preferred control relay is manufactured by the Allen Bradley corporation under the model number 700HA33A1. An energized or de-energized relay coil determines the state of the contacts on the control relay. All contacts are presumed normally-open when their respective control relay is de-energized, unless otherwise indicated herein.

The control relays 37a-37c are also conventional in design and are preferably manufactured by the Potter & Brumfield Corporation, under the model No. 10KP-11A15-120. The control relays 37a-37c are initially de-energized in the logic circuit. However, each relay is adapted to be energized when a potential difference appears across the relay coil, as described herein in more detail.

The relay contacts 35a-35c and 36a-36c of control relays 35, 36 control the voltage applied to the control relays 37a-37c. For example, relay contact 35a is adapted to control a first portion of the electrical path to control relay 37a. Similarly, relay contact 36a is adapted to control a second portion of the electrical path to control relay 37a. Both contacts 35a, 36a, must be closed for a distinct voltage phase from the voltage source to be applied to the control relay 37a, and likewise for control relays 37b, 37c.

Initially during the manufacturing process of the fault detection circuit, each variable resistor 32a-32c is calibrated so that the control relays 37a-37c are responsive to a potential difference established across the coils of each of the control relays. To this end, the conductor clamps 38a-38c are initially connected together and contacts 35a-35c, and 36a-36c are closed. The supply voltage 5 is enabled and a potential difference is created across each control relay 37a-37c.

The potential difference across the relays can be adjusted using the variable resistors 32a-32c. Each variable resistor 32a-32c is initially set to a high resistance, which limits the potential difference across the relays and maintains the relays in a de-energized state. The resistance setting of each of the variable resistors is then lowered until each control relay 37a-37c becomes energized. The conductor clamps are then adjusted for the impact test.

The voltage level at which the relays 37a–37c become energized is fixed by the internal parameters of the relay. When the voltage supply is enabled, the potential difference between two conductors is about 110 volts RMS. Similarly, the potential difference between a conductor and ground is also about 110 volts RMS. Accordingly, the variable resistors 32a–32c are adjusted during calibration until the lowest potential difference sufficient to energize each relay appears across each respective relay coil. Therefore, during an impact test, the control relays become energized when either a conductor-to-conductor or conductor-to-ground fault occurs in the cable, yet the resistors 30a–30c, in conjunction with variable resistors 32a–32c, function to limit the current through the fault detection circuit to which an operator may be exposed.

Consequently, during the impact test, if any of the conductors are shorted together, or are shorted to the grounded shield, a potential difference develops across at least one of the control relays 37a–37c. In the case of a conductor-to-conductor short, the control relays connected to each shorted conductor will become energized, while in the case of a conductor-to-ground short, the control relay connected to the shorted conductor will become energized.

Initially during the impact test, one end of each conductor is connected to a conductor clamp 38a–38c. The other end of each conductor in the cable is left unconnected and is allowed to float. A ground wire 40 is connected to the armor shield on the cable and to the test block. The voltage source 5 is then enabled and a distinct voltage phase is applied to each control relay 36a–36c in the logic circuit 8. For example, a distinct voltage phase from the voltage source 5 is applied to control relay 37a through fuse 28a, resistor 30a, variable resistor 32a, closed contact 35a and closed contact 36a. Control relay 37a remains de-energized at this point because both ends of the relay coil are at the same potential.

The impact test is performed such as, for example, described in UL test #1569, and a test block is dropped on a portion of the cable, as illustrated in FIG. 1. If the impact resistance of the cable is exceeded and two conductors in the cable are shorted together, a potential difference is created across two of the control relays. As described previously, the potential difference is established by the difference in voltage potential between two distinct voltage phases of the multiple phase voltage source 5. The potential difference in turn creates a current flow through the two relays, and the relays become energized.

Similarly, when a short exists between a conductor and the grounded shield, the potential difference will energize a single control relay. For example, if the conductor connected to clamp 38a contacts the grounded shield, a potential difference will be created across the coil of control relay 37a, which will thereby become energized.

Accordingly, a fault detection circuit constructed according to the present invention provides for energizing at least one control relay when a conductor-to-conductor or a conductor-to-ground fault occurs in a multiple conductor cable. Additionally, the circuit provides for limiting the current through the circuit to reduce the risk of electrical shock to the operator.

Figure 2:
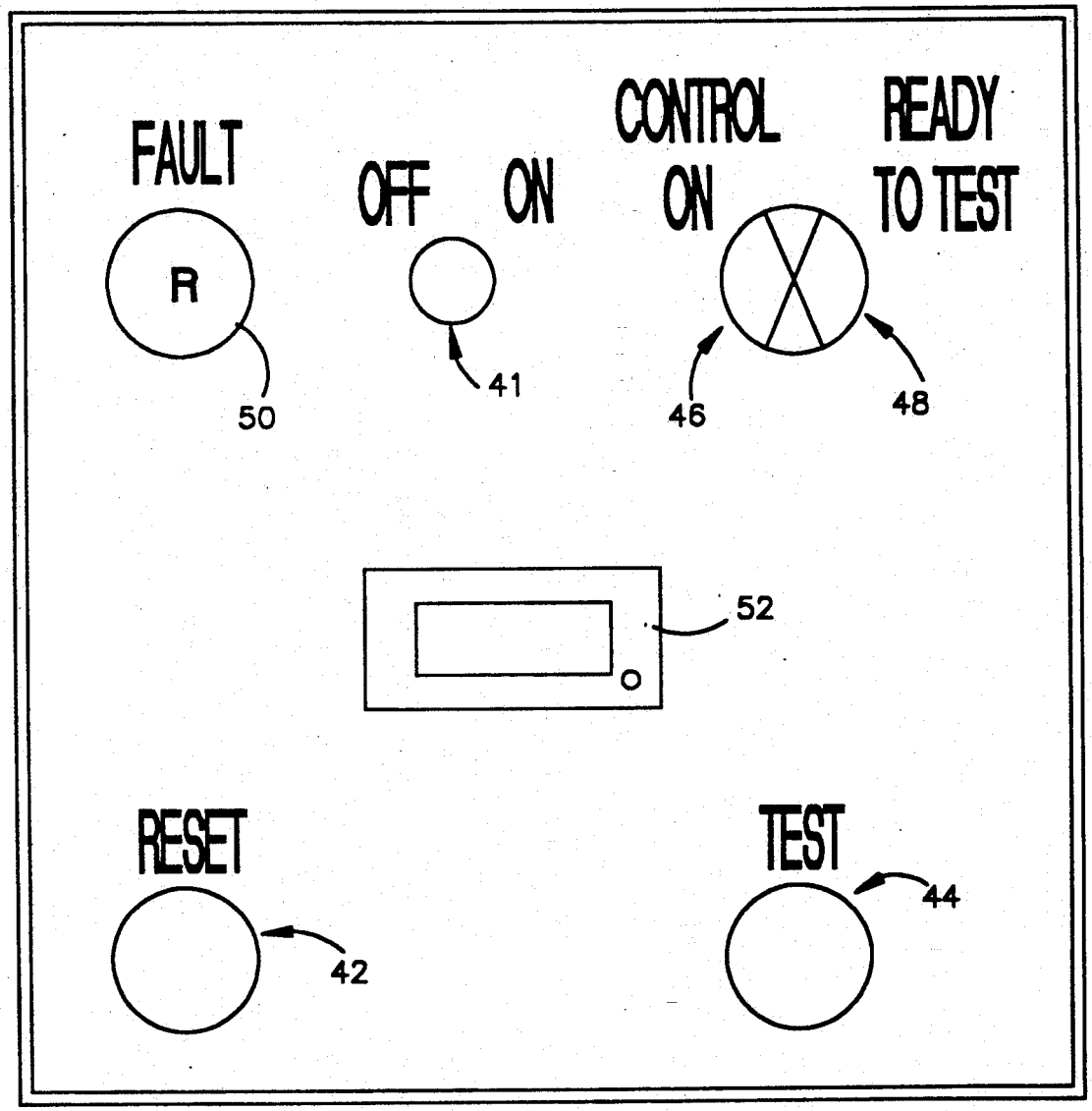
FIG. 2 is an illustration of the control box for the fault detection circuit of FIG. 1.

The logic circuit 8 is further adapted to provide the operator with a visual indication of a fault in the cable on a control panel 39, as illustrated in FIG. 2. The logic circuit provides a visual indication of either a conductor-to-conductor or conductor-to-ground fault in the cable.

The control panel 39 includes a power switch, indicated generally at 41, a reset button, indicated generally at 42, and a test button, indicated generally at 44. The panel further includes a "control on" lamp 46, a "ready to test" lamp 48, and a fault counter. The fault counter includes either a lamp 50 and/or a conventional analog counter 52.

The power switch 41, as shown in FIG. 1, has one terminal connected through lead 53 to fuse 28a and voltage supply 5. The other terminal of the power switch 41 is connected through lead 54 to one end of the parallel combination of control relay 35 and "control on" lamp 46. The other end of control relay 35 and lamp 46 are connected to the ground wire 40.

When the power supply switch 41 is toggled to the "on" position, as illustrated in FIG. 1 voltage is applied to relay 35, which is thereby energized, and to lamp 46, which is thereby illuminated. Energizing control relay 35 closes contacts 35a–35c and completes the first portion of the electrical path to each control relay.

The reset button 42 is a conventional push button switch having a first pole 42a and a second pole 42b. The two poles 42a, 42b are sequential in design wherein the first pole 42a completes electrical continuity before the second pole 42b. When pressed, the button is adapted to allow voltage to be applied to one end of control relay 36 through lead 43, pole 42a and lead 60. The other end of control relay 36 is connected to ground wire 40. When switches 41 and 42 are both enabled, control relay 36 is thereby temporarily energized. However, when the reset button 42 is released, relay 36 becomes de-energized.

Reset button 42 also provides a voltage path through pole 42b, through normally-closed contact 66a of control relay 66, and through lead 67 to one end of control relay 68. The other end of control relay 68 is connected to ground wire 40. Additionally, contact 68a of control relay 68 is connected across pole 42b. When switches 41 and 42 are both enabled, control relay 68 is temporarily energized, which closes contact 68a. When the reset button 42 is released, relay 68 remains energized because of the continuity through contact 68a.

The test button 44 has one terminal connected to switch 41 through lead 43, and the other terminal connected through lead 70 to one end of the parallel combination of control relay 72 and "ready to test" lamp 48. The other end of control relay 72 and lamp 48 are connected to ground wire 40. Additionally, relay contact 72a of control relay 72 is connected across the terminals of switch component 42a.

When the test button 44 is pressed, voltage is applied to relay 72, which is thereby energized, and to the "ready to test" lamp 48, which is thereby illuminated. The energized relay 72 in turn closes contact 72a, which provides a voltage through lead 60 to energize control relay 36. Energized control relay 36 in turn closes contacts 36a–36c, to complete the electrical continuity between the voltage supply 5 and each control relay 37a–37c.

Control relay contacts 75–77 are normally open contacts of relays 37a–c, respectively, and are connected in parallel between lead 43 and lead 73. Lead 73 in turn is connected to one end of the coil of control relay 66. The other end of the coil of control relay 66 is connected to ground wire 40. Additionally, normally-closed contact 68b of relay 68 is connected between lead 43 and lead 74. Lead 74 in turn is connected to one end of "fault" lamp 50. The other end of fault lamp 50 is connected to ground wire 40.

Control relays 36, 66 and 72 as described herein, are conventional in design and are also preferably manufactured by the Potter & Brumfield Corporation under model No. 10KP-11A15-120.

Initially during the impact test, power switch 41 is switched to an "on" position. "Control on" lamp 46 is illuminated and relay 35 is energized, which closes contacts 35a-35c to complete the first portion of the electrical path to each control relay. The reset button is then pushed, which energizes relay 68 and temporarily energizes control relay 36. Energizing relay 68 closes contact 68a and opens contact 68b, which renders the fault lamp 50 inoperable. The test button 44 is pressed, which lights the "ready to test" lamp 48 and energizes control relay 72, closes contact 72a, and thereby energizes control relay 36. Energized control relay 36 closes contacts 36a-36c thereby completing the electrical path between the voltage supply 5 and each control relay.

During the impact test, if a fault occurs between any of the conductors, or between a conductor and ground, at least one of control relays 37a-37c will become energized, as described previously. Energizing at least one of control relays 37a-37c will close at least one of the contacts 75-77 to energize control relay 66. Energized control relay 66 in turn opens contact 66a, which thereby de-energizes relay 68, opens contact 68a, and closes contact 68b. Closed contact 68b illuminates the fault lamp 50 to indicate a fault in a conductor of the cable. Alternatively, if fault counter 52 is used (FIG. 1A), the counter will indicate a fault.

After the impact test is run and a fault has occurred, fault lamp 50 will remain illuminated. Even if the conductors are removed from the conductor clamps, or if the fault is remedied, fault lamp 50 will remain illuminated to indicate a fault in the cable. Accordingly, the circuit is particularly suited to indicate momentary faults in the cable where a conductor is initially driven against another conductor or ground during the test, and then returns to its normal, non-shorted position.

If another test is required, test button 44 is released, and the conductors are removed or the fault is remedied, which de-energizes control relay 66. De-energized relay 66 in turn closes contact 66a. Reset button 42 is pressed, which energizes relay 68, closes contact 68a and opens contact 68b. Open contact 68b renders lamp 50 inoperable until the next fault occurs. Accordingly, the fault indicator circuit is reset for the next test.

If the reset button 42 is pressed and a fault remains in the cable, lamp 50 will remain illuminated to indicate that the fault must be remedied. In particular, 42a of reset button 42 completes electrical continuity to control relay 36 before pole 42b creates electrical continuity to control relay 68. Relay 36 thereby becomes energized, which completes the electrical continuity to control relays 37a-37c. The fault in the cable energizes at least one of the control relays 37a-37c to close at least one of the contacts 75-77, which in turn energizes control relay 66. Energized control relay 66 opens normally-closed contact 66a, which keeps control relay 68 from becoming energized, and keeps contact 68b closed. Closed contact 68b keeps lamp 50 illuminated to indicate a pre-existing fault in the cable. Accordingly, illuminated lamp 50 indicates that the fault must be remedied before the fault detection circuit is ready for the next test.

As described herein, the present invention provides a fault detection circuit for testing conductor-to-conductor and conductor-to-ground faults in multiple conductor shielded cables. Moreover, the present invention limits the current through the circuit to reduce the risk of electrical shock to the operator.

The principles, preferred embodiments, and modes of operation of the present invention have been described in the foregoing specification. The invention which is intended to be protected herein should not, however, be construed to the particular form described as it is to be regarded as illustrative rather than restrictive. Variations and changes may be made by those skilled in the art without departing from the spirit of the present invention. Accordingly, the foregoing detailed description should be exemplary in nature and not as limiting as to the scope in spirit of the invention set forth in the appended claims.

What is claimed is:

1. A low current fault detection circuit for testing an out of service multiple conductor cable having an outer conductive shield, comprising:
   a multiple phase voltage source for providing a distinct voltage phase to each of a plurality of conductors in the cable;
   a current limiting device electrically connected between each of the distinct voltage phases and each of the conductors,
   means for electrically connecting the cable shield to ground; and
   indicator means electrically coupled in series between each of the conductors and said voltage source, said indicator means including means responsive to the potential difference between phases in conductors when the conductors are electrically shorted together, and between a phase and ground when a conductor is shorted to the cable shield, said indicator means further including means to indicate a phase to phase and a phase to ground short in the cable.

2. A fault detection circuit as in claim 1, wherein said current limiting device includes a variable resistor.

3. A fault detection circuit as in claim 1, further including fuse means electrically connected in series between each of said distinct voltage phases and each of the conductors.

4. A fault detection circuit as in claim 3, wherein said indicator means is connected between each of said distinct voltage phases and each of the conductors, said current limiting device is connected between each of said distinct voltage phases and said indicator means, and said fuse means is connected between each said distinct voltage phases and said current limiting device.

5. A fault detection circuit as in claim 1, wherein the multiple phase voltage source provides distinct voltage phases having a potential difference of about 220 volts AC phase-to-phase.

6. A fault detection circuit as in claim 5, wherein said multiple voltage source provides three phases to three of the conductors, said phases being about 120° apart from each other.

7. A fault detection circuit as in claim 1, wherein each of the conductors are removeably connected to the detection circuit.

8. A fault detection circuit as in claim 1, wherein said indicator means includes relay means.

9. A fault detection circuit as in claim 8, wherein said indicator means includes a relay connected in series between said voltage source and each of said conductors, the relay connected between one of the conductors and the voltage source being energized when the one conductor is shorted to the cable shield and the remaining relay(s) being non-energized when a phase-to-ground short occurs in the cable, and the relays connected between a pair of conductors and the voltage source being energized when the pair of conductors are shorted together and the remaining relay(s) being non-energized when a phase-to-phase short occurs in the cable.

10. A fault detection circuit as in claim 1, wherein said indicator means includes fault counter means, said fault counter means including illuminating lamp or analog counter means.

11. A fault detection circuit as in claim 1, wherein said means responsive further includes a logic circuit, said logic circuit including a power supply switch for providing power to said logic circuit, a reset switch having means for resetting said logic circuit before testing for faults, and means for indicating power-on and ready-to-test.

12. A method for testing multiple conductor shielded cables for faults with a low current fault detection circuit, comprising the steps of:
maintaining the conductors in the cable free of applied voltage from an external source other than from the fault detection circuit,
connecting each of at least two conductors in the cable to a separate distinct voltage phase from a voltage source in the fault detection circuit,
connecting the shield of the cable to ground,
providing a current limiting device connected in series between each connected conductor and the voltage source to limit the current between the voltage source and each connected conductor,
providing relay means responsive to the potential difference between phases if two conductors are shorted together, and responsive to the potential difference between a phase and ground if a conductor is shorted to the shield, and
indicating a short in the cable on a fault counter when said relay means responds to a phase to phase or a phase to ground short in the cable.

13. A method for testing multiple conductor cables for faults as in claim 12, further comprising the step of impacting a portion of the cable with a test block.

14. A method as in claim 13, further comprising the steps of:
providing power to a test control circuit and energizing a first control relay, said first control relay closing one portion of the electrical path between said voltage source and said relay means,
selectively energizing a second control relay, said energized second control relay in turn energizing a third control relay,
said third control relay closing a second portion of the electrical path between said voltage source and said relay means and establishing a closed circuit therebetween,
energizing a fourth control relay and activating a corresponding indicator means in response to a phase-to-phase or phase-to-ground fault in the cable, said indicator means having means to indicate the fault in the cable.

15. A method as in claim 14, further comprising the steps of:
selectively energizing a fifth control relay and closing said second portion of the electrical path between said voltage source and said relay means and temporarily establishing a closed circuit therebetween,
energizing said fourth control relay in response to a pre-existing fault in the cable, said indicator means having means to indicate said pre-existing fault in the cable.

16. A low current electrical testing system, comprising:
a segment of a cable having a plurality of conductors and an outer conductive shield, said outer shield being electrically connected to ground and each of said conductors having one end which floats with respect to ground, and said cable being adapted to be impacted substantially transversely to its length,
first means for providing a distinct voltage phase from a voltage source to the other end of each conductor,
and second means responsive to the potential difference between said distinct voltage phases in conductors when the conductors are shorted together, and between a distinct voltage phase in a conductor and ground when a conductor is shorted to the cable shield, said second means including a current limiting device to limit the current through the conductors,
and third means to indicate a phase to phase or a phase to ground short in the cable with a lamp or counting device.

17. An electrical testing system as in claim 16, wherein the outer shield is the outermost layer on the cable.

18. A low current fault detection circuit for testing a multiple conductor cable having an outer conductive shield, comprising:
a multiple phase voltage source for providing a distinct voltage phase to one end of each of a plurality of conductors in the cable, the other end of each of the plurality of conductors being allowed to float with respect to ground;
means for electrically connecting the cable shield to ground;
a relay device electrically connected in series between each conductor and the voltage source for responding to the potential difference between phases in conductors when the conductors are electrically shorted together, and between a phase and ground when a conductor is shorted to the cable shield;
a current limiting device electrically connected in series between each relay device and the voltage source for limiting the current in each shorted conductor; and
a display device to visually indicate a phase to phase or a phase to ground short in the cable when any of said relay devices responds to a short in the cable.

19. A low current electrical testing circuit, comprising:
a segment of a cable having a plurality of conductors and a conductive armor shield, said conductive armor shield being electrically connected to ground and each of said conductors having one end which floats with respect to ground,
a voltage source for providing a distinct voltage phase to the other end of each conductor, at least one current limiting device electrically connected between the voltage source and the conductors in the cable to limit the current through the conductors, at least one switching device electrically connected between the voltage source and the conductors in the cable which is responsive to the potential difference between said distinct voltage phases in conductors when the conductors are shorted together, and between a distinct voltage phase in a conductor and ground when a conductor is shorted to the grounded cable shield, an indicator device electrically connected to said at least one switching device to indicate a phase to phase or a phase to ground short in the cable.

20. An electrical testing system as in claim 19, wherein the conductive armor shield is the outermost layer on the cable.

* * * * *